(12) United States Patent
How et al.

(10) Patent No.: US 7,108,470 B2
(45) Date of Patent: Sep. 19, 2006

(54) BUFFER DEVICE FOR SEMICONDUCTOR PROCESSING APPARATUS

(75) Inventors: Wee Kiun Francis How, Singapore (SG); Jian Zhang, Singapore (SG); Hong Yang Tim Wong, Singapore (SG)

(73) Assignee: ASM Technology Singapore PTE LTD, Singapore (SG)

( * ) Notice: Subject to any disclaimer, the term of this patent is extended or adjusted under 35 U.S.C. 154(b) by 265 days.

(21) Appl. No.: 10/426,116

(22) Filed: Apr. 29, 2003

(65) Prior Publication Data

US 2004/0218449 A1 Nov. 4, 2004

(51) Int. Cl.
*B65H 5/00* (2006.01)
(52) U.S. Cl. ............... 414/222.01; 414/941; 294/103.1
(58) Field of Classification Search ........... 414/222.01, 414/941; 198/347.2, 347.3, 346.2, 346.1; 211/13.1, 89.01; 206/832, 833; 294/103.1
See application file for complete search history.

(56) References Cited

U.S. PATENT DOCUMENTS

| 5,176,242 | A | * | 1/1993 | Wegscheider | ............ 198/347.3 |
| 5,417,537 | A | * | 5/1995 | Miller | ........................ 414/217 |
| 5,540,542 | A | * | 7/1996 | Krajec et al. | ........ 294/103.1 X |
| 5,960,960 | A | * | 10/1999 | Yamamoto | .............. 206/832 X |
| 6,536,608 | B1 | * | 3/2003 | Buckley | ................. 206/832 X |

* cited by examiner

*Primary Examiner*—Donald Underwood
(74) *Attorney, Agent, or Firm*—Ostrolenk, Faber, Gerb & Soffen, LLP

(57) ABSTRACT

The invention provides a buffer device for a processing apparatus for semiconductor components. The apparatus comprises a transportation track for conveying semiconductor components between processing machines, and a transfer mechanism for transferring semiconductor components between the transportation track and a receiving section of a processing machine along a travelling path. The buffer device is operative to receive and store semiconductor components from the transfer mechanism.

3 Claims, 4 Drawing Sheets

BUFFER DEVICE FOR SEMICONDUCTOR PROCESSING APPARATUS

FIELD OF THE INVENTION

The invention relates to a buffer device for temporary storage of semiconductor components in an in-line transportation mechanism, such as leadframes and other substrates in in-line semiconductor packaging equipment.

BACKGROUND AND PRIOR ART

It has become a norm to automate most, if not all of the process steps involved in the packaging of semiconductor components. Such automated assembly lines are also commonly referred to as in-line packaging equipment. With increased automation, the need to manage semiconductor components in an in-line system is becoming more important. An efficient transportation system is thus required to take into account varying processing speeds on different equipment in the in-line assembly system and reduce idling time when waiting to proceed to the next process.

In a typical in-line transporter for semiconductor assembly equipment, the work flow of the in-line transportation mechanism of the semiconductor components such as leadframes and other substrates into a work-holder is unidirectional. Being unidirectional makes the transportation process easier to handle. However, with increased sophistication in semiconductor packaging equipment, the ability of in-line transportation mechanisms to manage bi-directional movement becomes an advantage. An example of this is in the case of a wire-bonding machine with dual bond heads which can simultaneously perform wire-bonding on two separate leadframes. In a conventional wire-bonding machine with a single bond-head, unidirectional transportation has proven generally adequate. However, dual bond-head wire bonders have been configured to allow bi-directional flow of the leadframes into the work-holders of the wire-bonding machine for bonding and out of the work-holder after bonding.

Bi-directional transportation can be useful in the event that one of the transportation mechanisms or one of the bond heads on the wire-bonding machine is not functioning. Therefore, an operator may have to avoid routing leadframes through the non-functioning transportation machine or bond head. Since this might mean leadframes being transported in two directions along the same travel paths (as will be explained in greater detail below), there needs to be a system in place to avoid congestions or bottlenecks along the transportation paths.

SUMMARY OF THE INVENTION

It is an object of the invention to provide a buffer device for semiconductor assembly equipment that seeks to address the abovementioned needs.

Accordingly, the invention provides a processing apparatus for semiconductor components comprising a transportation track for conveying semiconductor components between processing machines; a transfer mechanism for transferring semiconductor components between the transportation track and a receiving section of a processing machine along a travelling path; and a buffer device operative to receive and store semiconductor components from the transfer mechanism.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of a buffer device in accordance with the invention will now be described with reference to the accompanying drawings, in which.

DETAILED DESCRIPTION OF THE PREFERRED EMBODIMENT OF THE INVENTION

Figure 1:
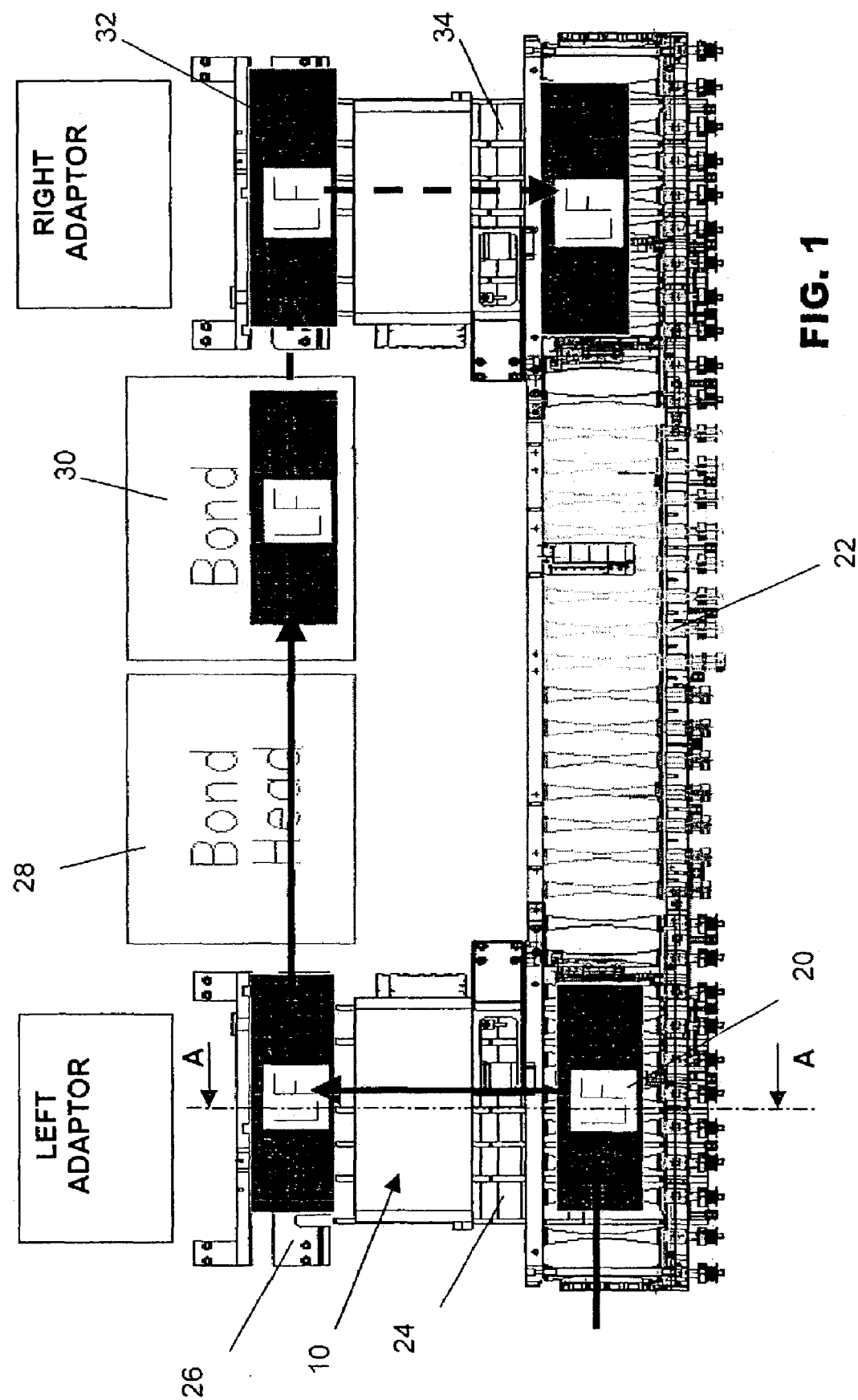
FIG. 1 illustrates a unidirectional work-flow of leadframes between a main transportation track and work-holders of a wire-bonding machine.

FIG. 1 illustrates a unidirectional work-flow of semiconductor components, such as leadframes, between a main transportation track 22 and work-holders of a processing machine, in the form of a wire-bonding machine comprising two bond-heads 28, 30. The in-line transportation track 22 conveys leadframes 20 between processing machines, generally in a direction from left to right in FIG. 1. Only a section of the in-line transportation mechanism that is adjacent to the wire-bonding machine with dual bond heads 28, 30 is shown. Leadframes 20 are moved along the main transportation track 22 of the in-line system and are stopped at a position in front of a left adaptor of the wire-bonding machine. A transfer mechanism 24 of the left adaptor transfers leadframes 20 from the main track 22 to a receiving section of the machine, which may be a rear track 26 of the left adaptor, along a predefined travelling path. The transfer mechanism 24 may comprise a lifting structure that is adapted to support a leadframe 20 along the travelling path. A rolling mechanism (not shown) on the rear track 26 sends leadframes 20 partially into a work-holder of a first bond head 28 of the wire-bonding machine. A left indexer (not shown) then grips the leadframes 20, and manoeuvres the leadframes 20 to multiple bonding positions and orientations so that wire-bonding may take place on the contact pads of the leadframes 20. Since the bond heads 28, 30 are capable of simultaneous independent operation, a first leadframe 20 may be held under the second bond head 30 for wire-bonding while a second leadframe 20 may be held under the first bond head 28 for wire-bonding. A right indexer (not shown) similarly manoeuvres leadframes 20 for wire-bonding with respect to the second bond head 30.

After bonding is completed by either the first bond head 28 or the second bond head 30, the right indexer pushes the leadframe 20 into the rear track 32 of a right adaptor. From the rear track 32, a transfer mechanism 34 of the right adaptor lifts and transfers processed leadframes 20 back onto the main track 22. The processed leadframe 20 is then transported to another packaging equipment along the assembly line.

Figure 2:
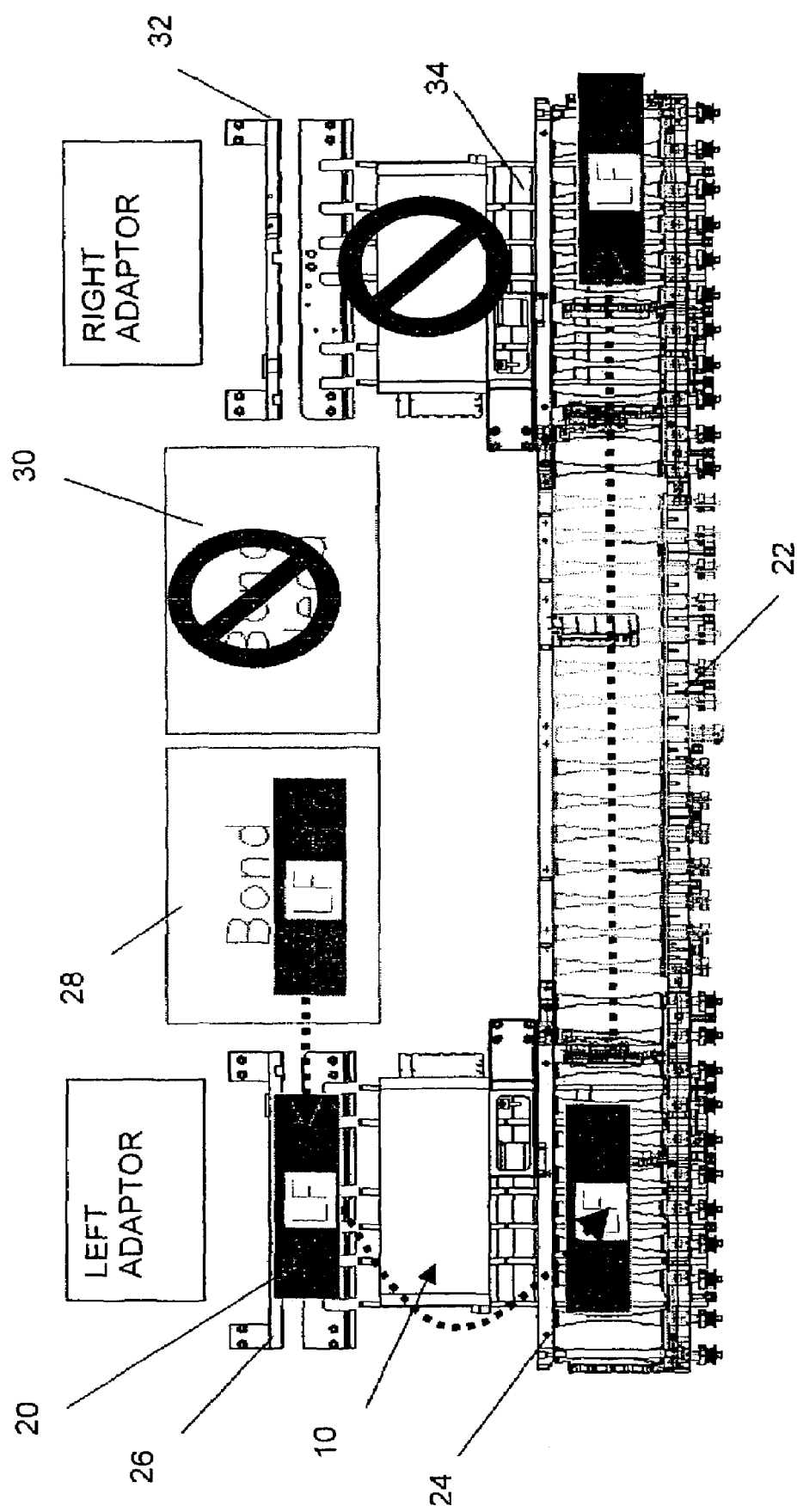
FIG. 2 illustrates a bi-directional work-flow of leadframes that is adapted when an adaptor or a bond head of the wire-bonding machine is not functioning.

FIG. 2 illustrates a bi-directional work-flow of leadframes 20 that is adopted when an adaptor or a bond head of the wire-bonding machine is not functioning, so that normal unidirectional work-flow of the transportation mechanism is disrupted. The transportation mechanism will now be programmed to handle a bi-directional work-flow, that is, leadframes 20 enter and leave the work-holders of the bond heads 28, 30 in two directions along the same travelling path. When this happens, when a leadframe 20 is in the work-holder being bonded, no further leadframes 20 can be transferred from the main track 22 to the work-holder of the first bond head 28. As a result, leadframes 20 on the main track 22 waiting to be wire-bonded must remain stationary, thereby disrupting the flow of leadframes 20 upstream along the assembly line. With a buffer device 10 of the invention, a number of leadframes 20 waiting to be wire-bonded can be stored temporarily in the buffer device 10 while another leadframe is being bonded in order to allow traffic along the main track 22 to continue to flow.

Similarly, if the first bond head 28 is not functioning, a travelling path between the rear track 32 of the right adaptor (which acts as a receiving section) and the main track 22 should also be bidirectional. Thus, it would be preferable to have a second buffer device 10 in relation to this second travelling path.

Figure 3:
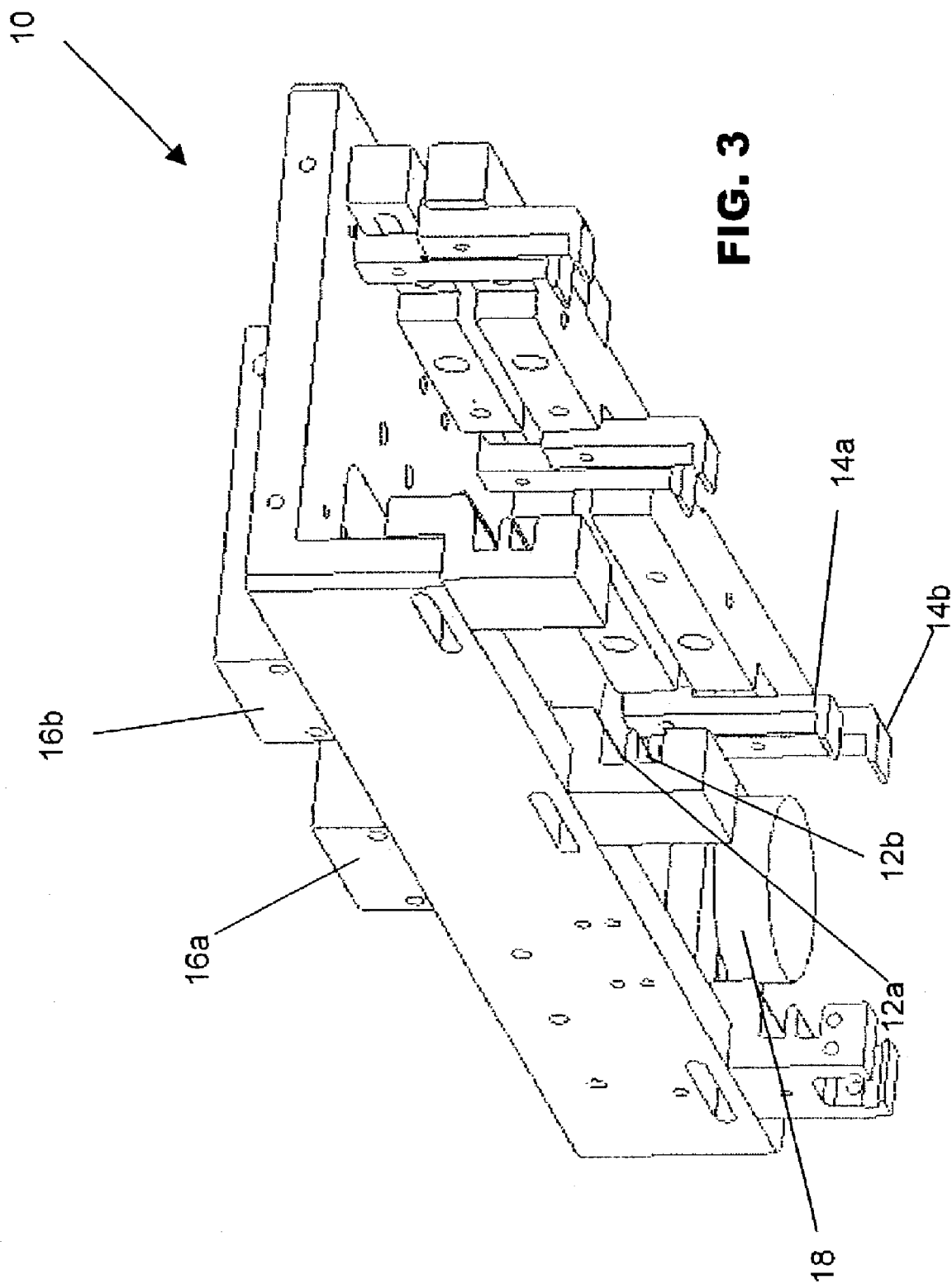
FIG. 3 is an isometric view of a buffer device according to the preferred embodiment of the invention.

FIG. 3 is an isometric view of a buffer device 10 according to the preferred embodiment of the invention. The buffer device 10 comprises means to hold leadframes 20, such as by gripping. Therefore, it may comprise holding means in the form of multiple sets of holding jaws 12, 14 mounted near the bottom of the said buffer device 10. The said jaws may include a set of three stationary jaws 12 and a set of three movable jaws 14. The holding jaws 12, 14 preferably define a plurality of compartments for holding a plurality of semiconductor components 20, which may be arranged vertically. In one embodiment, each set of stationary jaws 12 and movable jaws 14 has two levels. Thus, each upper level of the movable jaw 14a forms a first storage level with each upper level of the stationary jaws 12a, and each lower level of the movable jaws 14b forms a second storage level with the lower level of the stationary jaws 12b.

Preferably, two pneumatic cylinders 16a, 16b are mounted in association with the buffer device 10 to separately actuate the upper movable jaws 14a and lower movable jaws 14b respectively. The pneumatic cylinders 16a, 16b will move the jaws 14a, 14b when compressed air is introduced. The moving directions of the movable jaws 14a, 14b may therefore be designed to be dependent on the direction of air input/output into or out of the pneumatic cylinders 16a, 16b. Furthermore, each set of movable jaws 14a, 15b are movable independently of each other. Together with the stationary jaws 12, each set of movable jaws 14a, 14b define a compartment for holding a semiconductor component or leadframe 20.

Figure 4:
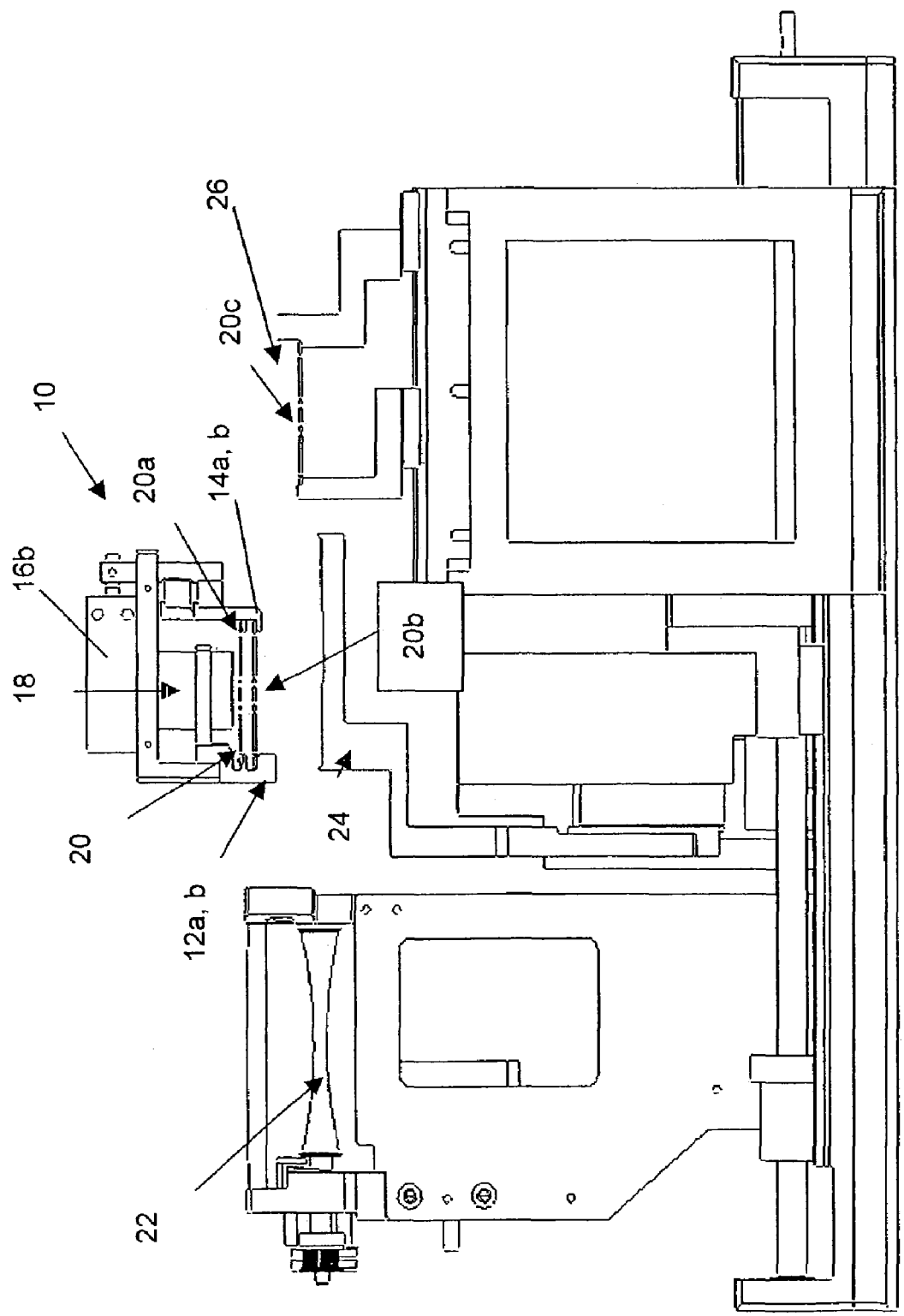
FIG. 4 is a cross-sectional view of the apparatus of FIG. 1 along sectional line A—A of FIG. 1.

FIG. 4 is a cross-sectional view of the apparatus of FIG. 1 along sectional line A—A of FIG. 1. The buffer device 10 is mounted between the main track 22 and the rear track 26 of the left adaptor. In use, leadframes 20 are stopped at a position adjacent to the transfer mechanism 24. The leadframes 20 are lifted by the transfer mechanism 24 from the main track 22 and subsequently placed onto the rear track 26. The leadframes 20 are then moved from the rear track 26 to the work-holders of the bond heads 28, 30 as described above.

When there is, for example, a need to allow leadframes 20 to travel in two directions between the main track 22 and the rear track 26, after a leadframe 20c has been fed to a work-holder, it may be necessary to free the transfer mechanism 24 to allow transport of the wire-bonded leadframe 20c from the rear track 26 to the main track 22. Thus, the buffer device 10 may be utilised to receive and store leadframes 20 from the transfer mechanism 24. The transfer mechanism 24 is moved to a position below the buffer device 10 between the main track 22 and rear track 26. The transfer mechanism then moves up towards the buffer device 10 and aligns the left edge of a first leadframe 20a with the stationary upper jaw 12a. The transfer mechanism 24 then moves left so that the leadframe 20 enters the first storage level that is the stationary upper jaw 12a. The pneumatic cylinder 16a then actuates the movable upper jaw 14a towards the first leadframe 20a and the leadframe 20 is now held in place by both the stationary upper jaw 12a and movable upper jaw 14a. A sensor 18 may then detect and confirm the presence of the first leadframe 20a being stored in the buffer device 10.

The transfer mechanism 24 may then return to the main track 22 to lift a second leadframe 20b that is to be temporarily stored in the buffer device 10. The same sequence as described above will be repeated for the second leadframe 20b, except that the transfer mechanism 24 will now align the second leadframe and cause it to enter the stationary lower jaw 12b. The pneumatic cylinder 16b moves the lower movable jaw 14b towards the second leadframe 20b to cause it to be held by the lower jaws 12b, 14b. There may also be another sensor at the second storage level to detect or confirm the presence of a second leadframe 20b.

After the leadframe 20c has been wire-bonded and is to be transported downstream, the transfer mechanism 24 will transport the bonded leadframe 20c from the rear track 26 of the left adaptor to the main track 22. After removal of the bonded leadframe 20c, the transfer mechanism 24 may now return to the buffer device 10 to offload the second leadframe 20b, followed by the first leadframe 20a, from the buffer device 10 in a first-in last-out manner. In a reverse procedure to the loading process described above, the transfer mechanism 24 lifts each leadframe 20a, 20b off its holding jaw 12, 14 followed by opening up of the respective movable jaw 14a, 14b. Each leadframe 20a, 20b is then sequentially sent to the rear track 26 of the left adaptor to be transported to the work-holder of the bond head 28 for wire-bonding, and out of the rear track 26 after bonding.

It should be appreciated that an additional buffer device 10 of the present embodiment having an identical function and form can be mirrored on the right adaptor which may also provide a buffer for leadframes 20 in the event that bi-directional movement of leadframes over the right adaptor is also desired.

The invention described herein is susceptible to variations, modifications and/or additions other than those specifically described and it is to be understood that the invention includes all such variations, modifications and/or additions which fall within the spirit and scope of the above description.

The invention claimed is:

1. A processing apparatus for semiconductor components comprising:
    a transportation track for conveying semiconductor components between processing machines;
    a transfer mechanism for transferring semiconductor components between the transportation track and a receiving section of a processing machine along a traveling path; and
    a buffer device including holding jaws operative to receive and store semiconductor components from the transportation track, wherein:

the transfer mechanism is selectively operable to transfer semiconductor components to and from the buffer device;

the holding jaws comprise stationary jaws, and movable jaws that are movable relative to the stationary jaws, such that a semiconductor component is held when the movable jaws are moved to a position to support it; and the movable jaws are movable independently of each other.

2. A processing apparatus according to claim 1, wherein the movable jaws are controllable in sets, and each set of independently movable jaws define a compartment for holding a semiconductor component.

3. A processing apparatus for semiconductor components comprising:

a transportation track for conveying semiconductor components between processing machines;

a transfer mechanism for transferring semiconductor components between the transportation track and a receiving section of a processing machine along a traveling path; and a buffer device including holding jaws operative to receive and store semiconductor components from the transportation track, wherein:

the transfer mechanism is selectively operable to transfer semiconductor components to and from the buffer device;

the holding jaws comprise stationary jaws, and movable jaws that are movable relative to the stationary jaws, such that a semiconductor component is held when the movable jaws are moved to a position to support it; and further including pneumatic cylinders operative to actuate movement of the movable jaws.

* * * * *